US009915878B2

(12) United States Patent
Shibazaki

(10) Patent No.: US 9,915,878 B2
(45) Date of Patent: Mar. 13, 2018

(54) EXPOSURE APPARATUS, EXPOSURE METHOD, AND DEVICE MANUFACTURING METHOD

(71) Applicant: NIKON CORPORATION, Tokyo (JP)

(72) Inventor: Yuichi Shibazaki, Kumagaya (JP)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 15/204,389

(22) Filed: Jul. 7, 2016

(65) Prior Publication Data

US 2016/0357116 A1    Dec. 8, 2016

Related U.S. Application Data

(63) Continuation of application No. PCT/JP2015/050404, filed on Jan. 8, 2015.

(30) Foreign Application Priority Data

Jan. 16, 2014 (JP) .................. 2014-005684

(51) Int. Cl.
G03F 7/20 (2006.01)
G03F 9/00 (2006.01)
G03F 7/32 (2006.01)

(52) U.S. Cl.
CPC ............ *G03F 7/70583* (2013.01); *G03F 7/32* (2013.01); *G03F 7/706* (2013.01); *G03F 7/7085* (2013.01); *G03F 7/70716* (2013.01); *G03F 7/70775* (2013.01)

(58) Field of Classification Search
CPC ........ G03F 7/32; G03F 7/70583; G03F 7/706; G03F 7/70716; G03F 7/70775; G03F 7/7085
USPC .................. 430/30, 296, 394, 942
See application file for complete search history.

(56) References Cited

U.S. PATENT DOCUMENTS

| | | | |
|---|---|---|---|
| 4,780,617 A | 10/1988 | Umatate et al. | |
| 5,448,332 A | 9/1995 | Sakakibara et al. | |
| 5,646,413 A | 7/1997 | Nishi | |
| 5,969,441 A | 10/1999 | Loopstra et al. | |
| 6,208,407 B1 | 3/2001 | Loopstra | |
| 6,341,007 B1 | 1/2002 | Nishi et al. | |
| 6,400,441 B1 | 6/2002 | Nishi et al. | |
| 6,549,269 B1 | 4/2003 | Nishi et al. | |
| 6,590,634 B1 | 7/2003 | Nishi et al. | |
| 6,611,316 B2 | 8/2003 | Sewell | |
| 6,952,253 B2 | 10/2005 | Lof et al. | |
| 7,023,610 B2 | 4/2006 | Ohtsuki et al. | |
| 2003/0025890 A1 | 2/2003 | Nishinaga | |
| 2004/0207824 A1 | 10/2004 | Lof et al. | |
| 2004/0218181 A1 | 11/2004 | Jones et al. | |
| 2006/0261288 A1 | 11/2006 | Van Santen | |
| 2012/0099089 A1 | 4/2012 | Sogard | |
| 2012/0133914 A1 | 5/2012 | Prosyentsov et al. | |

FOREIGN PATENT DOCUMENTS

| | | |
|---|---|---|
| EP | 1 420 298 A2 | 5/2004 |
| JP | H02-262320 A | 10/1990 |
| JP | H10-247617 A | 9/1998 |
| JP | 2003-142365 A | 5/2003 |
| JP | 2006-184091 A | 7/2006 |
| JP | 2012-119680 A | 6/2012 |
| JP | 2013-175541 A | 9/2013 |
| WO | 2004/055803 A1 | 7/2004 |

OTHER PUBLICATIONS

Apr. 7, 2015 International Search Report issued in International Patent Application No. PCT/JP2015/050404.
Jul. 19, 2016 International Preliminary Report on Patentability issued in International Patent Application No. PCT/JP2015/050404.
Jun. 1, 2017 Office Action issued in Japanese Patent Application No. 2015-557811.
Translation of JP H02-262320, Oct. 25, 1990.
Translation of JP 2013-175541, Sep. 5, 2013.
Translation of JP 2003-142365, May 16, 2003.
Translation of JP H10-247617, Sep. 14, 1998.
Aug. 25, 2017 Extended Search Report issued in European Patent Application No. 15737108.9.
Nov. 27, 2017 Office Action issued in Korean Patent Application No. 10-2016-7021913.
Jan. 5, 2018 Office Action issued in Japanese Patent Application No. 2015-557811.

*Primary Examiner* — Christopher G Young
(74) *Attorney, Agent, or Firm* — Oliff PLC

(57) ABSTRACT

An exposure apparatus transfers a pattern on a wafer by irradiating a reticle with an illumination light, and the pattern is formed on a pattern surface of the reticle. The exposure apparatus is provided with a reticle stage that moves holding the reticle, and a sensor that irradiates a measurement light on the pattern surface of the reticle held by the reticle stage and detects speckles from the pattern.

15 Claims, 8 Drawing Sheets

EXPOSURE APPARATUS, EXPOSURE METHOD, AND DEVICE MANUFACTURING METHOD

CROSS-REFERENCE TO RELATED APPLICATIONS

This application is a continuation of International Application PCT/JP2015/050404, with an international filing date of Jan. 8, 2015, the disclosure of which is hereby incorporated herein by reference in its entirety, which was not published in English.

BACKGROUND OF THE INVENTION

Field of the Invention

The present invention relates to exposure apparatuses, exposure methods, and device manufacturing methods, and more particularly to an exposure apparatus and an exposure method used in a lithography process for manufacturing electronic devices, and a device manufacturing method using the exposure apparatus and the exposure method.

Description of the Background Art

Conventionally, in a lithography process for manufacturing electronic devices (micro-devices) such as semiconductor devices (such as ICs) and liquid crystal display devices, sequential-moving type projection exposure apparatuses are mainly used, such as a projection exposure apparatus of a step-and-repeat method (a so-called stepper) and a projection exposure apparatus of a step-and-scan method (a so-called scanning stepper (also called a scanner)).

With these type of exposure apparatuses, a pattern formed on a mask or a reticle (hereinafter referred to collectively as a "reticle") is transferred on each of a plurality of shot areas on an object such as a wafer or a glass plate (hereinafter referred to collectively as a "wafer") coated with a sensitive agent (a resist), via a projection optical system.

Since these types of projection exposure apparatuses are used to manufacture micro-devices, to make the device serving as an end product have a desired performance, it is important to be able to accurately overlay and form a reduced image of the pattern formed on the reticle (referred to as the exposure pattern) corresponding to the projection magnification of the projection optical system on the pattern actually formed in each shot area on the wafer (referred to as the base pattern); that is, the overlay accuracy is important.

However, in the actual exposure sequence, exposure operation is performed through a wafer alignment mark formed on the wafer in a predetermined positional relation with each shot area and a reticle alignment mark formed on the reticle in a predetermined positional relation with the exposure pattern, presuming that the alignment marks represent the position of the pattern (e.g., refer to U.S. Pat. No. 5,646,413). In this manner, the position of the actual pattern is indirectly presumed from the position of the alignment marks.

The above presumption stands for the reason below. For example, in the case of the reticle side, since the reticle alignment mark and the exposure pattern are drawn simultaneously with an electron-beam exposure apparatus on the same glass substrate (reticle blank), the positional relation between the reticle alignment mark and the exposure pattern is secured to a drawing error level of the electron-beam exposure apparatus. Accordingly, the position of the exposure pattern whose positional relation with the reticle alignment mark is known can be presumed favorably when detection (measurement) of the position of the reticle alignment mark is performed.

The above presumption, however, is made on the premise that the position of the exposure pattern and the reticle alignment mark do not change, therefore the presumption may not actually stand. The most common example can be the case when a variation (distortion) occurs in the exposure pattern due to thermal deformation (such as thermal expansion) of the reticle by irradiation of the exposure light. Normally, reticle alignment (alignment of the reticle or position measurement for the alignment) is performed, using the reticle alignment mark located at four points in the periphery of the reticle. In this reticle alignment, however, only magnification change in the X-axis direction and the Y-axis direction and linear components such as orthogonality and rotation are obtained, in addition to positional information in a surface of the exposure pattern (for example, within the XY plane). That is, information cannot be obtained of non-linear shape change that occurs in the reticle due to heat absorption (e.g., shape change to a shape that resembles a map symbol of a bank, or to a shape of a barrel).

Drawing more reticle alignment marks at places in the periphery of the exposure pattern on the reticle blank, and measuring the marks at the time of reticle alignment allow a more accurate approximation, since the outer periphery shape of the exposure pattern can be recognized. In this case, however, in addition to requiring time for measurement which greatly reduces the throughput, errors occur in the presumption when distortion (deformation state) of the periphery of the pattern area of the exposure pattern and distortion of the actual pattern within the pattern area do not have a proportional relation. The influence is especially great, for example, such as when the shot size is not full-field and the width or total length of the shot is small, or when the transmittance distribution within the reticle pattern area is uneven.

SUMMARY OF THE INVENTION

According to a first aspect of the present invention, there is provided an exposure apparatus that irradiates an energy beam on a mask and transfers a pattern formed on a pattern surface of the mask onto an object, comprising: a mask stage that moves, holding the mask; and a sensor that irradiates a measurement light on a predetermined surface of the mask held by the mask stage and obtains information regarding a speckle from the predetermined surface.

According to this apparatus, information on the predetermined surface of the mask can be obtained, based on the information regarding the speckle obtained from the sensor.

According to a second aspect of the present invention, there is provided an exposure method in which an energy beam is irradiated on a mask, and a pattern formed on a pattern surface of the mask is transferred onto an object, comprising: irradiating a measurement light on a predetermined surface of the mask at a first point of time, and detecting and keeping a first information of a first area on the predetermined surface; irradiating the measurement light on the first area and detecting a second information of the first area, after a predetermined time has passed from the first point of time; and obtaining a variation information of the first area caused by irradiation of the energy beam on the mask, based on the second information of the first area that has been detected and the first information kept.

According to this method, the variation information on the first area of the predetermined surface caused by the irradiation of the energy beam on the mask can be obtained.

According to a third aspect of the present invention, there is provided a device manufacturing method, the method including: transferring the pattern onto a sensitive substrate using the exposure method according to the second aspect; and developing the sensitive substrate on which the pattern has been transferred.

BRIEF DESCRIPTION OF THE DRAWINGS

In the accompanying drawings.

DESCRIPTION OF THE EMBODIMENTS

Hereinafter, an embodiment is described, based on FIGS. 1 to 7.

Figure 1:
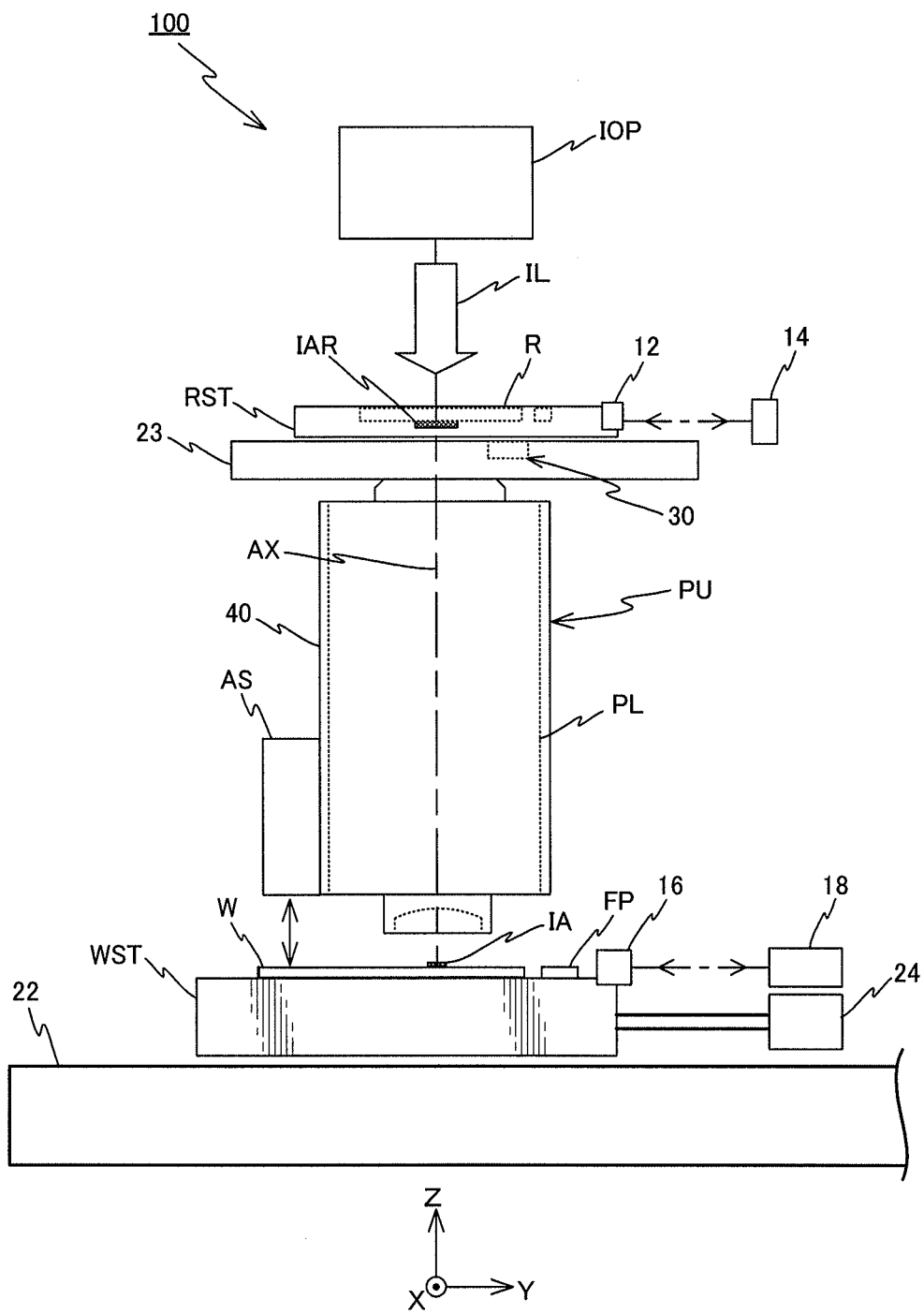
FIG. 1 is a view schematically showing a structure of an exposure apparatus according to an embodiment.

FIG. 1 shows a schematic structure of an exposure apparatus 100 in accordance with an embodiment. Exposure apparatus 100 is a projection exposure apparatus of a step-and-scan method, or a so-called scanner. As it is described later on, a projection optical system PL is provided in the present embodiment, and in the description below, the embodiment is to be described with a direction parallel to an optical axis AX of projection optical system PL serving as a Z-axis direction, a scanning direction within a plane orthogonal to the Z-axis direction in which a reticle and a wafer are relatively scanned serving as a Y-axis direction, a direction orthogonal to the Z-axis and the Y-axis serving as an X-axis direction, rotation (tilt) directions around the X-axis, the Y-axis, and the Z-axis serving as θx, θy, and θz directions.

Exposure apparatus 100 includes an illumination system IOP, a reticle stage RST that holds a reticle R, a projection unit PU that projects an image of a pattern formed on reticle R on a wafer W coated with a sensitive agent (resist), a wafer stage WST that moves within an XY plane holding wafer W, and a control system for these parts.

Illumination system IOP, which includes a light source and an illumination optical system connected to a light source via a light-sending optical system, illuminates an almost uniform illumination light (exposure light) IL on a slit-shaped illumination area IAR extending narrowly in the X-axis direction (orthogonal direction of the page surface in FIG. 1) on reticle R set (limited) by a reticle blind (a masking system). The structure of illumination system IOP is disclosed, for example, in U.S. Patent Application Publication No. 2003/0025890. An example of illumination light IL used includes an ArF excimer laser beam (wavelength 193 nm).

Reticle stage RST is placed below illumination system IOP in FIG. 1. Reticle stage RST is finely drivable within a horizontal plane (XY plane) on a reticle stage surface plate 23 and is also drivable in the scanning direction (the Y-axis direction, which is the lateral direction of the page surface in FIG. 1) in a predetermined stroke range, by a reticle stage driving system 11 (not shown in FIG. 1, refer to FIG. 3) that includes, for example, a linear motor. Reticle stage surface plate 23 has an opening 23 of a predetermined shape formed in the center penetrating in the Z-axis direction that serves as a passage of illumination light IL (refer to FIG. 2B).

Figure 2A:
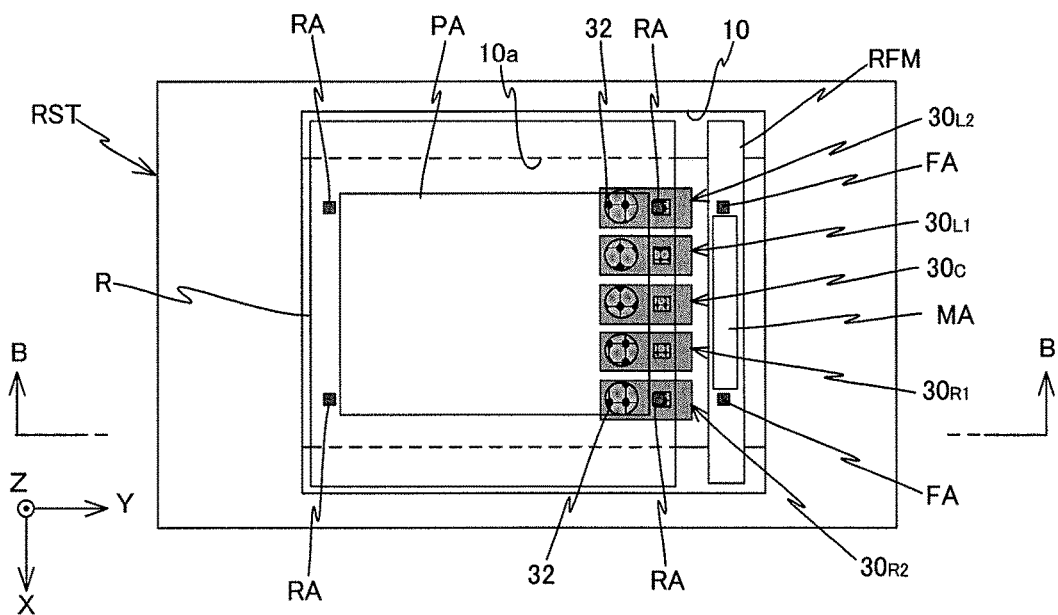
FIG. 2A is view of a reticle stage of FIG. 1 when viewed from above (+Z direction)

Reticle R is mounted on reticle stage RST. Reticle R is made of an almost square glass plate as shown in FIG. 2A, and in the center of a surface on the −Z side, a rectangular-shaped pattern area PA is formed elongate in the Y-axis direction. In the description below, the surface on the −Z side of reticle R on which pattern area PA is formed is to be called a pattern surface. On the pattern surface, reticle alignment marks (hereinafter shortly referred to as reticle marks) RA are formed in pairs (a total of four marks) at positions on both edges in the X-axis direction of pattern area PA, close to both sides of pattern area PA in the Y-axis direction. These four reticle marks RA are drawn simultaneously on the pattern surface with a pattern (an exposure pattern) of pattern area PA by an electron-beam exposure apparatus. In the present embodiment, positional relation between the four reticle marks and pattern area PA is maintained as designed, that is, the drawing error of the electron-beam exposure apparatus that draws the pattern of pattern area PA (exposure pattern) and reticle marks RA is to be zero (or small enough to be ignored).

Figure 2B:
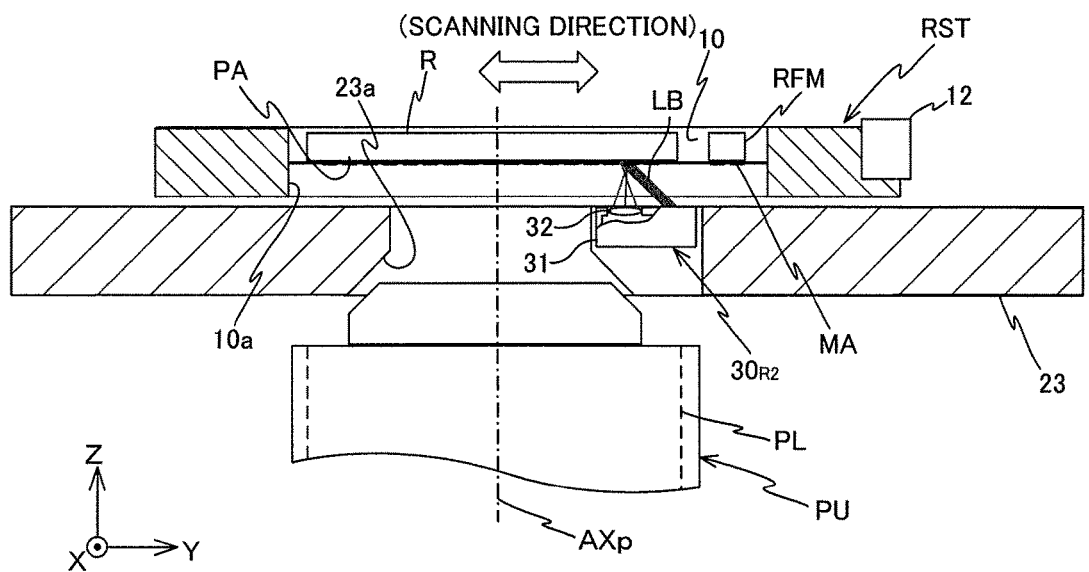
FIG. 2B is a sectional view of the reticle stage and its vicinity sectioned along a line B-B of FIG. 2A.

Reticle stage RST is made of a rectangular-shaped plate member as shown in FIGS. 2A and 2B, and on its upper surface, a rectangular-shaped recess section 10 is formed whose size in the Y-axis direction is longer than the length of reticle R in the Y-axis direction and size in the X-axis direction is slightly longer than the length of reticle R in the X-axis direction. In recess section 10, an opening 10a penetrating in the Z-axis direction is formed in the center of the X-axis direction along the entire Y-axis direction.

Reticle R is placed close to the −Y side edge in recess section 10, in a state where pattern area PA is positioned within opening 10a. Reticle R, for example, is vacuum chucked by a suction section not shown arranged on the upper surface of steps at both sides in the X-axis direction of opening 10a.

Figure 3:
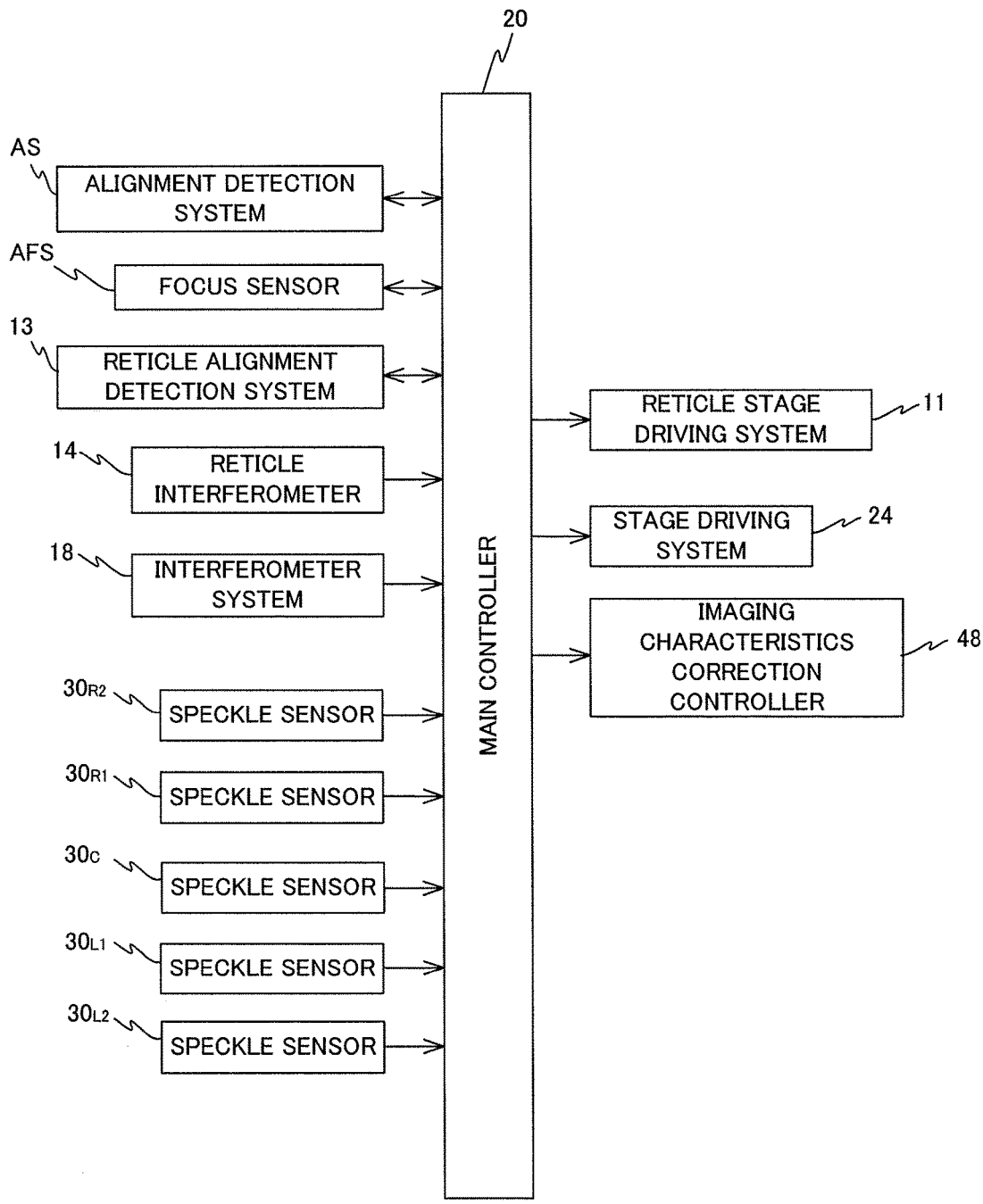
FIG. 3 is a block diagram showing an input/output relation of a main controller that mainly structures a control system of the exposure apparatus according to the embodiment.

Near the +Y side edge inside recess section 10, a reticle fiducial plate (hereinafter shortened to a fiducial plate) RFM extending in the X-axis direction is arranged laid on the upper surface of the steps at both sides in the X-axis direction of opening 10a, away from reticle R to the +Y side by a predetermined distance. Fiducial plate RFM has both ends in the longitudinal direction fixed to the upper surface of the steps at both sides in the X-axis direction of opening 10a. Fiducial plate RFM is made of glass having a low thermal expansion coefficient such as, for example, Zerodur (product name) of Schott AG, having a pair of alignment marks FA formed on its lower surface (−Z side surface) spaced in the same manner in the X-axis direction as the pair of reticle marks RA on reticle R. Alignment marks FA and reticle marks RA are identical; however, a different reference sign is used here for identification. Further, in a state where reticle R is loaded on reticle stage RST as shown in FIG. 3, the pairs of reticle marks RA and the pair of alignment marks FA are positioned almost at the same X position. The lower surface (−Z side surface) of fiducial plate RFM has a mark area MA formed that contains various kinds of marks formed (i.e., a plurality of AIS mark blocks that include various kinds of measurement marks used for aerial image measurement), formed in a state where both ends of the mark area in the longitudinal direction are close to the pair of alignment marks FA. Mark area MA and pattern area PA are set to be almost the same height.

Referring back to FIG. 1, positional information of reticle stage RST in the XY plane (including rotation information in the θz direction) is constantly detected at a resolution of around 0.25 nm, using a reticle laser interferometer (hereinafter referred to as a "reticle interferometer") 14, via a movable mirror 12 (or a reflection surface formed on the edge of reticle stage RST). Measurement information of reticle interferometer 14 is supplied to main controller 20 (not shown in FIG. 1, refer to FIG. 3). Incidentally, positional information of reticle stage RST in the XY plane described above may be measured by an encoder, instead of reticle interferometer 14.

Furthermore, as shown in FIGS. 1, 2A, and 2B, inside reticle stage surface plate 23, a pattern measurement device 30 used for measuring temporal variation of the pattern of reticle R, is arranged in a plurality of numbers (for example, five), spaced at a predetermined distance in the X-axis direction as an example. Pattern measurement device 30 is to be described later in the description.

Projection unit PU is placed below reticle stage RST in FIG. 1. Projection unit PU includes a barrel 40, and projection optical system PL held within barrel 40. Projection optical system PL is, for example, double telecentric, having a predetermined projection magnification (i.e., ¼ times, ⅕ times, or ⅛ times). Therefore, when illumination light IL from illumination system IOP illuminates illumination area IAR on reticle R, illumination light IL that passes through reticle R placed so that its pattern surface almost coincides with a first plane (an object plane) of projection optical system PL forms a reduced image of the circuit pattern of reticle R in illumination area IAR (a reduced image of a part of the circuit pattern) via projection optical system PL, on an area (hereinafter also called an exposure area) IA conjugate to illumination area IAR on wafer W that has a resist (sensitive agent) coated on its surface, placed at a second plane (image plane) side of projection optical system PL. Then, by a synchronous drive of reticle stage RST and wafer stage WST, reticle R relatively moves in the scanning direction (the Y-axis direction) with respect to illumination area IAR (illumination light IL) and wafer W relatively moves in the scanning direction (the Y-axis direction) with respect to exposure area IA (illumination light IL), allowing scanning exposure of a shot area (a divided area) on wafer W so that the pattern of reticle R is transferred onto the shot area.

As projection optical system PL, for instance, a refractive system is used, consisting only of a plurality of dioptric elements (lens elements) such as, for example, ten to twenty, arranged along optical axis AX parallel to the Z-axis direction. The plurality of lens elements at the object plane side (reticle R side) of the plurality of lens elements structuring projection optical system PL are movable lenses that can be shifted in the Z-axis direction (optical axis direction of projection optical system PL) and driven in tilt directions with respect to the XY plane (i.e., the θx direction and the θy direction), by driving elements not shown like piezoelectric elements. An imaging characteristics correction controller 48 (not shown in FIG. 1, refer to FIG. 3) independently adjusts the applied voltage to each driving element based on instructions from main controller 20, so that each movable lens is driven independently to adjust various imaging characteristics of projection optical system PL (such as magnification, distortion aberration, astigmatism, coma aberration, and field curvature). Incidentally, a structure can be employed where imaging characteristics correction controller 48 controls pressure of gas in an air-tight chamber arranged in between adjacent specific lens elements within barrel 40 instead of, or in addition with moving the movable lens, or imaging characteristics correction controller 48 can shift the center wavelength of illumination light IL. These structures also allow adjustment of imaging characteristics of projection optical system PL.

Wafer stage WST is driven in predetermined strokes on wafer stage surface plate 22 by a stage driving system 24 (illustrated as a block in FIG. 1 for the sake of convenience) that includes a linear motor or a planar motor in the X-axis direction and the Y-axis direction, and is also finely driven in the Z-axis direction, the θx direction, the θy direction, and the θz direction. On wafer stage WST, wafer W is held by vacuum chucking or the like via a wafer holder (not shown). Incidentally, instead of wafer stage WST, a stage apparatus may also be used that includes a first stage moving in the X-axis direction, the Y-axis direction, and the θz direction and a second stage finely moving on the first stage in the Z-axis direction, the θx direction, and the θy direction.

Positional information of wafer stage WST in the XY plane (including rotation information (yawing amount (rotation amount in the θz direction, θz), pitching amount (rotation amount in the θx direction, θx), and rolling amount (rotation amount in the θy direction, θy))) is constantly detected at a resolution of around 0.25 nm, using a laser interferometer system (hereinafter shortly referred to as an interferometer system) 18, via a movable mirror 16 (or a reflection surface formed on the edge of wafer stage WST). Incidentally, the positional information of wafer stage WST in the XY plane may be measured by an encoder, instead of interferometer system 18.

Measurement information of interferometer system 18 is supplied to main controller 20 (refer to FIG. 3). Main controller 20 controls the position of wafer stage WST in the XY plane (including rotation in the θz direction), based on measurement information of interferometer system 18 via stage driving system 24.

Further, although it is omitted in FIG. 1, the position of the surface in the Z-axis direction and the tilt amount of wafer W is measured using a focus sensor AFS (refer to FIG. 3) consisting of a multi-point focal point detection system that employs an oblique incidence method, as is disclosed in, for example, U.S. Pat. No. 5,448,332. Measurement information of this focus sensor AFS is also supplied to main controller 20 (refer to FIG. 3).

Further, on wafer stage WST, a fiducial plate FP is fixed whose surface is arranged at the same height as the surface of wafer W. On the surface of fiducial plate FP, marks are formed, such as a first fiducial mark used for measurement as in a base line measurement of an alignment detection system AS, which is to be described next, and a pair of second fiducial marks detected by a reticle alignment detection system to be described later on.

Provided on the side surface of barrel 40 of projection unit PU is alignment detection system AS, used for detecting the alignment marks or the first fiducial mark formed on wafer W. As alignment detection system AS, for example, an FIA (Field Image Alignment) system is used, which is a type of an image-forming alignment sensor using an image-processing method in which a mark position is measured by illuminating a mark with a broadband (wideband) light such as a halogen lamp and image-processing an image of this mark.

Exposure apparatus 100 furthermore has a pair of reticle alignment detection systems 13 (not shown in FIG. 1, refer to FIG. 3) provided spaced apart by a predetermined distance in the X-axis direction above reticle stage RST, and the pair of reticle detection systems can simultaneously detect the pair of reticle marks RA located at the same Y position on reticle R mounted on reticle stage RST. Each reticle alignment detection system 13 is a detection system employing a VRA (Visual Reticle Alignment) method that measures the mark position by image-processing data of the image of the alignment mark picked up by an imaging device such as a CCD camera, and is structured including a vertical illumination system for irradiating an illumination light having the same wavelength as illumination light IL on the alignment mark, and a detection system for imaging the image of the alignment mark (none of which are shown). Imaging results of the detection system (i.e., detection results of the mark by reticle alignment detection system 13) are supplied to main controller 20. Reticle alignment detection system 13 each has a mirror that can be freely inserted to or withdrawn from the optical path of illumination light IL, and when the mirror is inserted along the optical path of illumination light IL, the detection system guides the illumination light outgoing from the vertical illumination system (not shown) to reticle R so that it illuminates reticle R, and also guides a detection light that occurs due to the illumination which passes through the path of; reticle R→projection optical system PL→an object on wafer stage WST (e.g., fiducial plate FP)→projection optical system PL→reticle R, and then to the detection system of reticle alignment detection system 13. Incidentally, the mirror described above is withdrawn to the outside of the optical path of illumination light IL based on instructions from main controller 20 by a driving device not shown when the exposure sequence begins, before the irradiation of illumination light IL begins to transfer the pattern of pattern area PA (exposure pattern) on reticle R onto wafer W.

Next, the five pattern measurement devices 30 are described. The five pattern measurement devices 30 are placed spaced apart in the X-axis direction, as shown in FIG. 2A. The Y position of the five pattern measurement devices 30 is arranged at a position slightly offset to the +Y side from optical axis AX of projection optical system PL, as shown in FIG. 2B. Since each pattern measurement device 30 is used to acquire information regarding a speckle from a target as it is described later on, in the description below, the pattern measurement devices are to be called speckle sensors 30, and to identify each sensor, the sensors are referred to in order from the +X side as; speckle sensor $30_{R2}$, speckle sensor $30_{R1}$, speckle sensor $30_C$, speckle sensor $30_{L1}$, and speckle sensor $30_{L2}$. "Information regarding a speckle," here, refers to information related to contrast of spot patterns that are generated when reflected lights of a measurement light (e.g., a coherent laser beam) scattering on a surface of a target (e.g., a reticle serving as an object) interfere with one another, and examples include information regarding speckle, speckle noise, and speckle pattern.

Speckle sensor $30_{R2}$ and speckle sensor $30_{L2}$, which are positioned at both edges in the X-axis direction, are arranged at positions that can overlap the pair of reticle marks RA on reticle R in a planar view.

Since the five speckle sensors 30 have the same structure except for their placement which is different, the description below will focus representatively on the structure and the like of speckle sensor $30_2$.

Speckle sensor $30_{R2}$ is a type of encoder that is structured similarly to a speckle-image-based optical position transducer whose details are disclosed in, for example, U.S. Patent Application Publication No. 2004/0218181. Speckle sensor $30_{R2}$, which includes a housing 31, a light source, a lens 32, a pinhole plate having a pinhole plate, a light detector, and a signal generating and processing circuitry (only housing 31 and lens 32 are illustrated in FIG. 2B), is provided inside reticle stage surface plate 23.

The light source, housed inside housing 31, irradiates a laser beam (or other coherent beam of light) LB on an optically rough diffusion surface serving as a target (pattern area PA part of the pattern surface of reticle R, in the case of FIG. 2B) from a direction tilted with respect to a normal direction (the Z-axis direction) of the roughened light diffusion surface, via a light transmitting section provided at housing 31. As the light source of the coherent beam of light, a light source that radiates a laser beam is generally used. However, any other known or a later developed coherent light source that is capable of radiating a coherent beam of light can also be used. It should be noted, that the reason for using the light source radiating a coherent beam of light is because it allows speckle measurement with higher precision than when white light is used.

Lens 32 is placed in an opening formed in the upper wall of housing 31 (wall surface on the +Z side), fixed to housing 31 in a state where its optical axis coincides with the Z-axis direction. The upper surface of the upper wall of housing 31 where lens 32 is placed almost coincides with the upper surface of reticle stage surface plate 23.

The pinhole plate (not shown) is placed on a rear focal plane on the −Z side of lens 32, in a state where the center of the pinhole almost coincides with the optical axis of lens 32. The light detector (not shown) is placed distanced to the −Z side from the pinhole plate. In this case, the optical system including lens 32 and the pinhole plate is a telecentric optical system.

The light detector used may include, for example, a charge-coupled device (CCD) or an array of CMOS light-sensitive elements.

The signal generating and processing circuitry, which is connected to the light source and the light detector, is structured similarly to the signal generating and processing circuitry disclosed in, for example, U.S. Patent Application Publication No. 2004/0218181.

Detection principle of a speckle using speckle sensor $30_{R2}$ will now be briefly described. As shown in FIG. 2B, laser beam LB emitted obliquely with respect to the Z-axis from the light source inside of speckle sensor $30_{R2}$ irradiates a portion of an area of the optically rough diffusion surface serving as a target (pattern area PA of the pattern surface of reticle R in the case of FIG. 2B), namely, an area in the pattern surface including a portion of the pattern, and from the area, lights are generated such as a scattered light, a diffracted light, and/or an interference light between the diffracted lights. These lights are collected by lens 32, and projected onto an area on the pinhole plate that includes the pinhole. Then, the light passes through the pinhole, proceeds along the optical axis of lens 32 and then is projected onto the light-receiving plane of the light detector. This allows detection information of the light detector to be sent to the signal generating and processing circuitry, and the signal generating and processing circuitry to detect speckles according to the method disclosed in, for example, U.S. Patent Application Publication No. 2004/0218181.

It should be appreciated that the optically rough diffusion surface is not limited to the pattern surface of reticle R, and may be a predetermined surface of reticle R. The predetermined surface of reticle R may also be, for example, the upper surface of reticle R (a surface on a side opposite to the pattern surface) or the side surface of reticle R.

As is previously described, since a telecentric optical system is employed in this case, speckle sensor $30_{R2}$ is less sensitive to changes in the gap between the pattern surface and the upper surface of reticle stage surface plate 23. Moreover, by using a pinhole plate, the speckle (image) size depends solely on the dimensions of the pinhole, and more particularly becomes independent of any lens parameters of lens 32.

Other speckle sensors $30_{R1}$, $30_C$, $30_{L1}$, and $30_{L2}$ are structured similarly to speckle sensor $30_{R2}$ described above. Speckle information from the signal generating and processing circuitry of the five speckle sensors $30_{R2}$, $30_{R1}$, $30_C$, $30_{L1}$, and $30_{L2}$ is to be supplied to main controller 20 (refer to FIG. 3). The five speckle sensors $30_{R2}$, $30_{R1}$, $30_C$, $30_{L1}$, and $30_{L2}$ each have a detection area which is the irradiation area on the pattern surface of laser beam LB emitted from each of the light sources (the area on the +Z side of each lens 32), and these irradiation areas are arranged spaced apart in the X-axis direction on the pattern surface according to the placement of speckle sensors $30_{R2}$, $30_{R1}$, $30_C$, $30_{L1}$, and $30_{L2}$ (refer to the placement of the five lenses 32 in FIG. 2A).

FIG. 3 is a block diagram that shows an input/output relation of main controller 20 which mainly structures the control system of exposure apparatus 100. Main controller 20, which includes a microcomputer (or a workstation) or the like, has overall control over exposure apparatus 100.

Next, a measurement method is described for measuring a variation amount (distortion amount) within a pattern surface intersecting optical axis AX of the pattern in pattern area PA of reticle R such as, for example, in a pattern surface parallel to the XY plane orthogonal to optical axis AX, performed in exposure apparatus 100 according to the present embodiment.

The measurement principle, first of all, will be briefly described.

At first, when the exposure pattern (reticle R) is used for the first time, a one-time operation is performed of aligning reticle R at a predetermined position via reticle stage RST and detecting speckles of at least a portion of an area of pattern area PA of reticle R using speckle sensor 30, i.e., a portion of an area of the pattern surface including a part of the pattern, and then the detection results are stored as speckle information in a reference state (origin point state). It should be appreciated that the speckle detection described above may also be performed on the pattern surface that includes the entire pattern (e.g., the whole area of pattern area PA).

After a predetermined period of time has passed from the point when the speckle detection in the reference state described above has been performed, for example, in the case illumination light IL is irradiated during the predetermined period, variation (displacement) of (each portion of) pattern area PA of reticle R occurs by several nm due to thermal deformation of the reticle (such as thermal expansion) within the pattern surface. The speckles, therefore, obtained at this point by detecting the portion of the area of pattern area PA of reticle R as is described above, change, according to the variation of several nm when reticle R is aligned at the predetermined position described above at the time of detection.

Therefore, by aligning reticle R at the predetermined position described above and using speckle sensor 30 to perform the speckle detection of the portion of the area of pattern area PA of reticle R, and then performing a predetermined calculation using the difference between the speckle information in the reference state detected and stored in advance and the speckle information detected afterward, the difference is to be converted into a variation amount ($\Delta X$, $\Delta Y$) of pattern area PA. While the case has been described here where the speckle detection is performed by aligning reticle R at a predetermined position and detecting the speckles in the same area of the pattern surface at two points of time, in the case detection is performed while moving reticle R, the variation amount ($\Delta X$, $\Delta Y$) of a portion of an area of pattern area PA can be obtained, based on the difference between the speckle information detected afterward and the speckle information in the reference state detected and stored in advance, similar to the description above. Positional information of reticle R can be accurately measured at a resolution of 0.25 nm by reticle interferometer 14, which allows comparison (difference) of the speckles from patterns at the same coordinate position, as long as reticle stage RST (reticle R) is moved in the same manner at the time of detection of the speckles afterward and the time of detection of the speckles in the reference state.

Next, a concrete example of a measurement method of the variation amount of the pattern (exposure pattern) of pattern area PA of reticle R, using the five speckle sensors, will be described.

First of all, when a specific reticle R is loaded on reticle stage RST for the first time, an operation of measuring (detecting) a speckle that the exposure pattern of reticle R produces (an initial measurement operation to be described later) is performed, and the measurement results are stored in a storage device (not shown) that main controller 20 has. If reticle R (pattern) differs, speckles that can be acquired from the reticle also turn out to be unique, so the initial measurement operation has to be performed once for each reticle. In the present embodiment, an initial measurement operation described below is performed on the reticle that may be used, and the measurement results are to be stored in the storage device that main controller 20 has. In the present embodiment, the reticles that may be used should have a positional relation between the four reticle marks RA and pattern area PA that meets the designed value.

The initial measurement operation is preferably performed in a reference state where reticle R subject to this measurement is not yet irradiated by illumination light IL, that is, in a state where reticle R is neither heated nor expanded and can be a reference to the exposure operation to be performed later on.

Figure 4A:
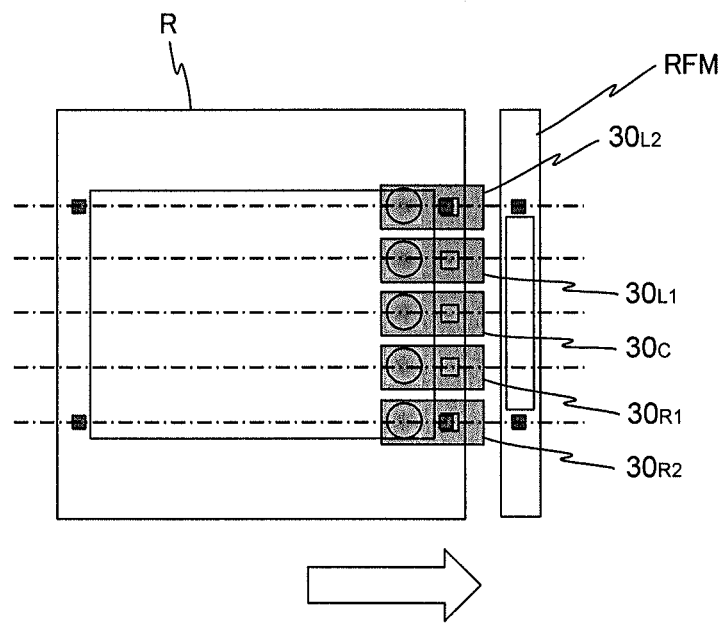
FIG. 4A is a view of assistance in explaining an initial measurement operation.

Specifically, as shown in FIG. 4A, main controller 20, by moving reticle stage RST in a scanning direction (scan direction) indicated by an outlined arrow in FIG. 4A at a constant velocity, scans fiducial plate RFM fixed on reticle stage RST and reticle R subject to measurement in the scanning direction (scan direction), likewise to, for example, when scanning exposure is performed, and successively acquires detection signals (speckle signals) from the signal generating and processing circuitry of the five speckle sensors $30_{R2}$, $30_{R1}$, $30_C$, $30_{L1}$, and $30_{L2}$.

Acquiring the speckle signals described above is performed synchronously with the timing when reticle interferometer 14 takes in the measurement signals. That is, main controller 20 stores information made to correspond between measurement values of reticle interferometer 14 and the speckle signals in the storage device. The speckle signals obtained at this point is random speckle information deriving from the exposure pattern of reticle R, and the signals do not yet contain any positional information that can be used. The speckle signals are merely in a state where a reference signal waveform has been obtained.

Figure 4B:
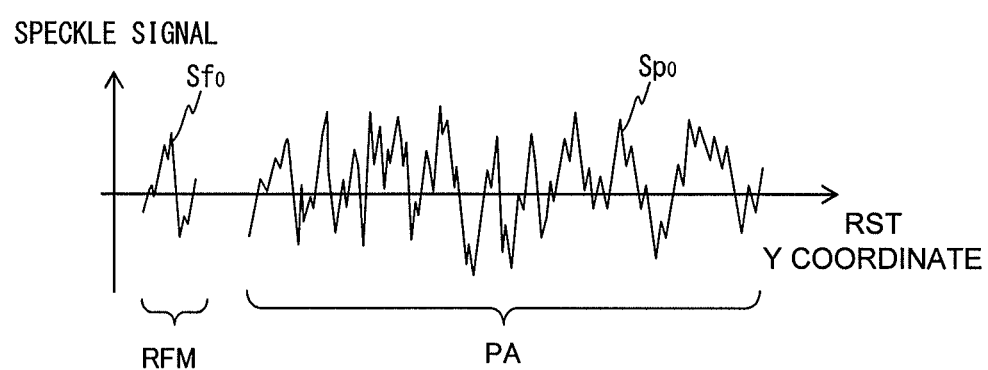
FIG. 4B is a view showing information of a speckle that can be obtained from a speckle sensor 30L1.

FIG. 4B, as an example, shows a conceptual diagram of the speckle information obtained from speckle sensor $30_{L1}$ at this point. In FIG. 4B, the horizontal axis indicates a Y coordinate of reticle stage RST on a stage coordinate system, and the vertical axis indicates a speckle signal. It should be noted that, although the speckle signal is indicated as a scalar quantity as a conceptual diagram for convenience of illustration in FIG. 4B, the speckle signal is actually a multi-dimensional information and not a scalar quantity. Furthermore, the signal waveform indicated by a reference sign $Sf_0$ shows a waveform of a speckle signal obtained from a portion of an area of fiducial plate RFM, and the signal waveform indicated by a reference sign $Sp_0$ shows a waveform of a speckle signal obtained from a portion of an area of pattern area PA of reticle R.

Meanwhile, just before starting exposure of the wafer in each lot, that is, at the time of reticle alignment performed on the first lot, main controller 20 performs the reticle alignment operation similarly to a normal scanner, using the pair of reticle alignment detection systems 13, the pair of the second fiducial marks of fiducial plate FP on wafer stage WST, and the four reticle marks RA. In addition, similarly to the time of the initial measurement operation previously described, main controller 20 moves reticle stage RST in the scanning direction (scan direction) at a constant velocity, and while scanning fiducial plate RFM fixed on reticle stage RST and reticle R in the scanning direction (scan direction), successively acquires speckle signals from the signal generating and processing circuitry of the five speckle sensors $30_{R2}$, $30_{R1}$, $30_C$, $30_{L1}$, and $30_{L2}$ synchronously with the timing when reticle interferometer 14 takes in the measurement signals, and stores the information in the storage device.

Then, main controller 20, by comparing the speckle obtained by the measurement at the time of this reticle alignment and the speckle of reticle R in the reference state acquired in advance, obtains the amount of displacement of each portion of pattern area PA of reticle R at the time of measurement with respect to the reference state by calculation.

Figure 5A:
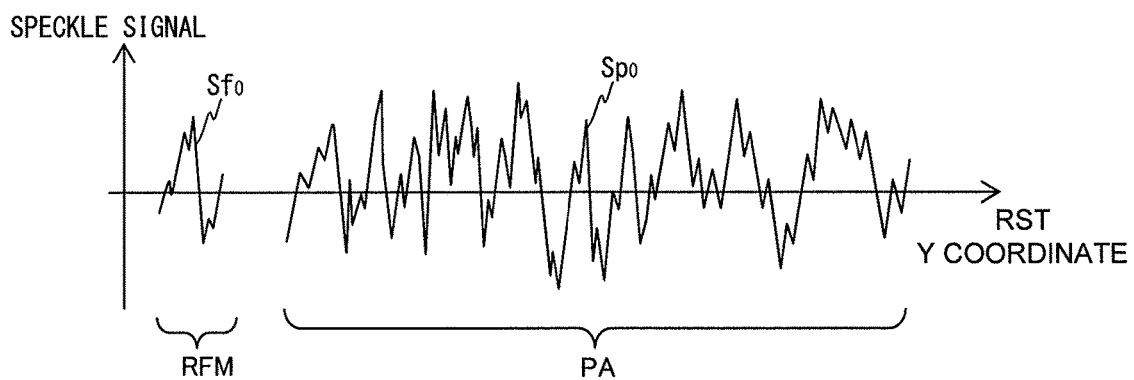
FIGS. 5A to 5D are views of assistance in explaining a measurement using the speckle sensor 30L1 performed on reticle alignment.
Figure 5B:
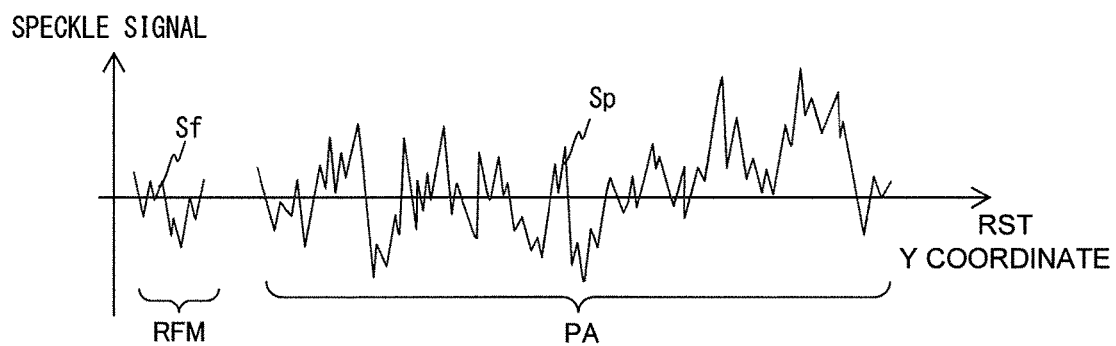
Figure 5C:
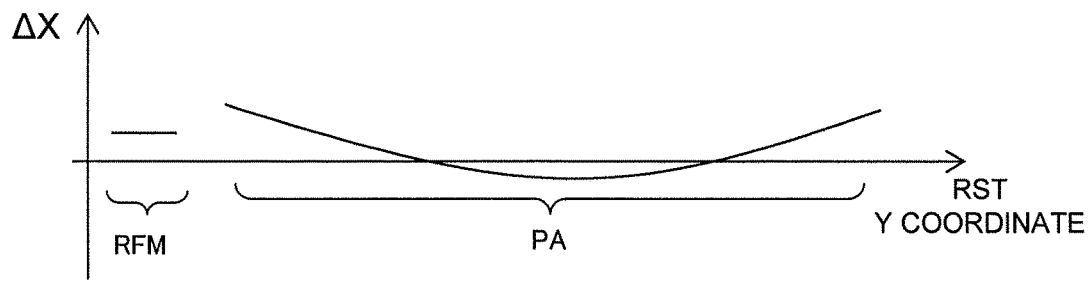
Figure 5D:
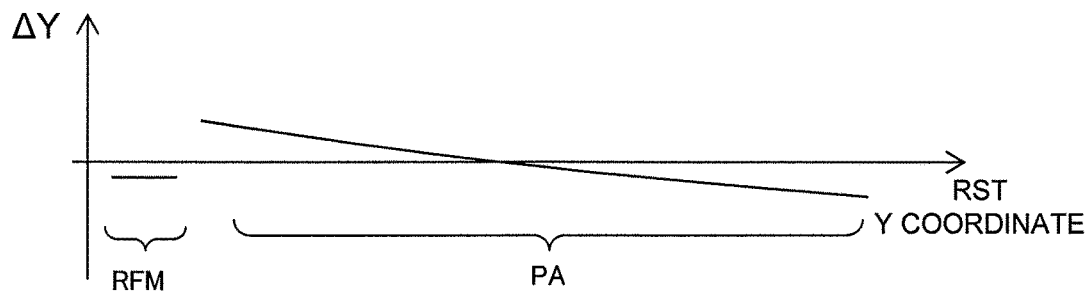
Figure 6:
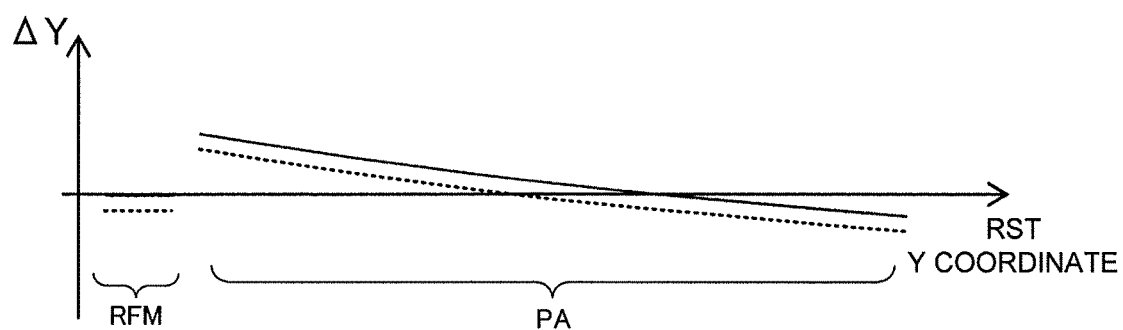
FIG. 6 is a view of assistance in explaining removal of a drift component in a sensor output.

As an example, in the case of describing measurement using speckle sensor $30_{L1}$, for example, from the difference between the speckle information obtained at the time of measurement (refer to signal waveforms Sf, Sp) indicated in FIG. 5B as a conceptual diagram and the speckle information in the reference state (refer to signal waveforms $Sf_0$, $Sp_0$) indicated in FIG. 5A as a conceptual diagram, the variation amount (X displacement ΔX and Y displacement ΔY) of each portion of the target with respect to the reference state is obtained, each illustrated as a conceptual diagram in FIGS. 5C and 5D. The target, other than a part of pattern area PA, includes a part of fiducial plate RFM (and reticle mark RA on reticle R).

The variation amount (X displacement ΔX and Y displacement ΔY) of each portion of the target with respect to a reference state similar to the description above is obtained as the measurement result using the remaining four speckle sensors $30_{L2}$, $30_C$, $30_{R2}$, and $30_{R1}$.

However, the attachment position and the attachment state of housing 31 of each speckle sensor 30 are considered to change over a long period, which causes a drift in the output of each speckle sensor 30, which in turn causes a measurement error in the variation amount previously described. Fiducial plate RFM is used in the present embodiment to remove the measurement error in the variation amount previously described caused by the drift that occurs temporally in the output of the speckle sensor. That is, fiducial plate RFM differs from reticle R and is free from the risk of thermal deformation even if a long time has passed after the beginning of exposure, therefore, the speckle obtained from fiducial plate RFM is not supposed to change from the reference state even at the time of measurement. Accordingly, X displacement ΔX and Y displacement ΔY obtained for fiducial plate RFM as in, for example, FIGS. 5C and 5D, can be considered to be a variation component (also referred to as a drift component) caused by temporal drift of the output of the corresponding speckle sensor (in this case, speckle sensor $30_{L1}$). Main controller 20, therefore, removes the measurement error described above of the variation amount previously described caused by the temporal drift of the output of the speckle sensor, by subtracting X displacement ΔX and Y displacement ΔY of the fiducial plate RFM part from the X displacement ΔX and Y displacement ΔY of the reticle pattern area PA part obtained from the measurement results of the same speckle sensor at the time of measurement.

For example, when Y displacement ΔY as indicated in FIG. 6A by the dotted lines of the speckle is obtained from the fiducial plate RFM part and the reticle pattern area PA part, by shifting the dotted lines in the Y-axis direction to the positions shown by the solid lines in the drawing, Y displacement ΔY of the pattern area PA part can be obtained, with the measurement error (drift component) caused by temporal drift of the output of the speckle sensor removed. The same applies for X displacement ΔX.

Figure 7A:
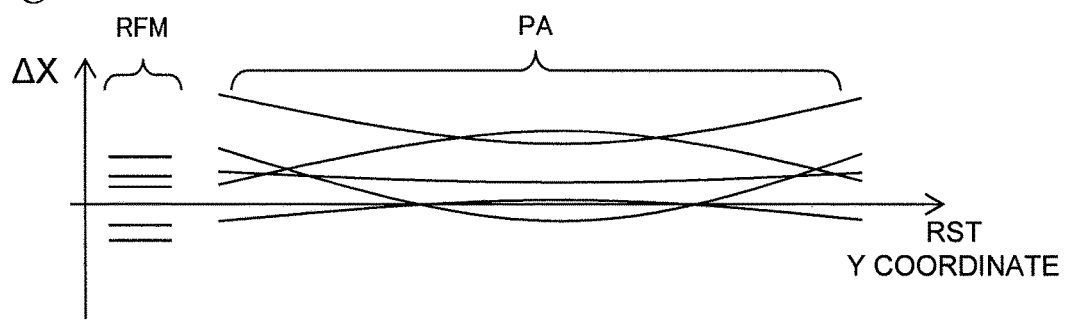
FIG. 7A is a view schematically showing an X displacement of each portion of a target obtained using five speckle sensors.
Figure 7B:
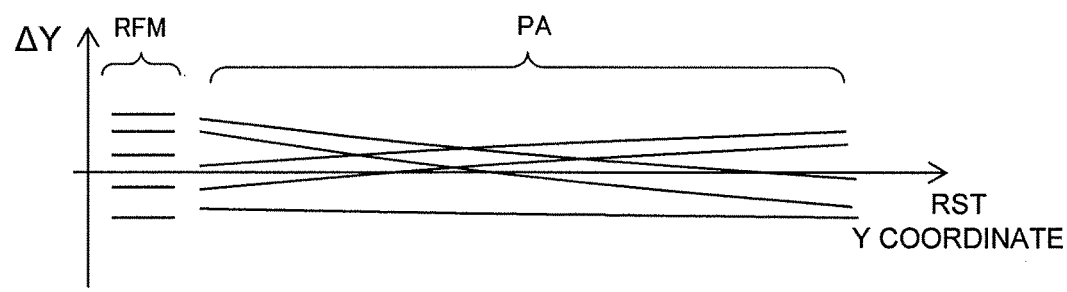
FIG. 7B is a view schematically showing a Y displacement of each portion of the target obtained using the five speckle sensors.

Main controller 20 therefore, as exemplified in FIGS. 7A and 7B, removes the drift component of the output of each speckle sensor shown on the left side of FIGS. 7A and 7B, which is obtained by applying the above description (after converting each speckle signal into displacement information) to X displacement ΔX and Y displacement ΔY of each portion of the target obtained by each of the five speckle sensor $30_{L2}$, $30_{L1}$, $30_C$, $30_{R2}$, and $30_{R1}$, from X displacement ΔX and Y displacement ΔY of the corresponding pattern area PA part shown on the right side.

Figure 7C:
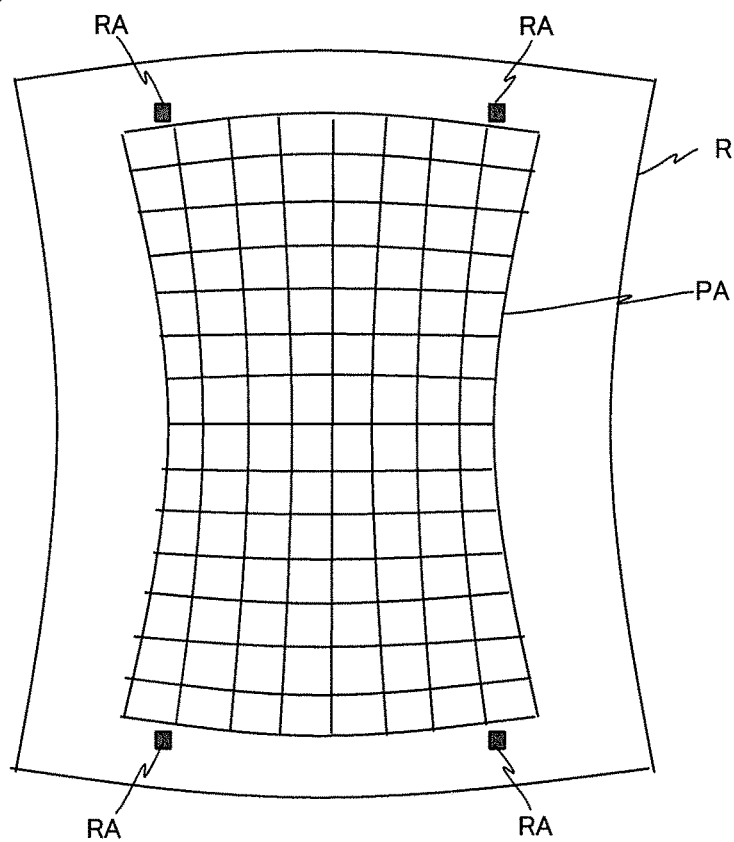
FIG. 7C shows an example of a two-dimensional distortion of a pattern area PA that has been obtained.

After this, based on the variation information (ΔX and ΔY) of pattern area PA obtained by the five speckle sensors $30_{L2}$, $30_{L1}$, $30_C$, $30_{R2}$, and $30_{R1}$ whose drift component has been removed and positional information of pattern area PA of reticle R (positional information with the position of the four reticle marks RA serving as a reference), main controller 20 can obtain a two-dimensional distorted shape of pattern area PA (i.e., variation information of reticle pattern area PA in the XY plane (displacement information)) with the position of reticle mark RA serving as a reference (refer to FIG. 7C). The reason why the distorted shape of pattern area PA can be obtained with the position of reticle mark RA serving as a reference, although it is not illustrated in FIGS. 7A and 7B, is actually because speckle sensors $30_{L2}$ and $30_{R2}$ measure the speckles from two each of the reticle marks RA and the measurement results of the speckles consequently include the positional information of these reticle marks RA. Moreover, although it is not described in particular so far, in the embodiment, positional information of reticle R after the reticle alignment is measured by reticle interferometer 14, which measures the positional information of reticle stage RST, and the installation position of each speckle sensor 30, and consequently, the position coordinates on the stage coordinate system of the detection area (irradiation area of laser beam LB on the pattern surface) are known. Main controller 20, accordingly, can calculate the Y position of reticle R and the corresponding irradiation position of laser beam LB on reticle R, when positional information measured by reticle interferometer 14 is available, such as, for example, the Y coordinate value (Y) of reticle stage RST. Therefore, of the speckle information measured using speckle sensors $30_{L2}$ and $30_{R2}$, it is easy to judge which part is the speckle information produced at reticle mark RA.

In exposure apparatus 100 according to the present embodiment, when wafer processing is performed on the first lot, for example, main controller 20 firstly loads reticle R on reticle stage RST and performs the reticle alignment and a baseline measurement of alignment detection system AS according to a procedure disclosed in, for example, U.S. Pat. No. 5,646,413, using the pair of reticle alignment detection systems 13, alignment detection system AS, and fiducial plate FP (the pair of the second fiducial marks and the first fiducial mark). Further, on the reticle alignment, according to the procedure described in detail above, main controller 20 obtains the two-dimensional distorted shape of pattern area PA, with the position of reticle mark RA serving as a reference.

Then, after the loading (or wafer exchanging) of wafer W onto wafer stage WST has been performed, main controller 20 executes alignment measurement (e.g., EGA) in which a plurality of alignment marks on wafer W are detected, using alignment detection system AS. Array coordinates of a plurality of shot areas on wafer W can be obtained by this operation. Incidentally, details on the alignment measurement (EGA) are disclosed in, for example, U.S. Pat. No. 4,780,617.

Next, main controller 20 performs an exposure operation by a step-and-scan method, in which a stepping operation between shots where wafer W is moved to an acceleration starting position for exposure of a plurality of shot areas on wafer W based on the results of the alignment measurement and the scanning exposure operation are repeated, so as to sequentially transfer the pattern of reticle R onto all of the shot areas on wafer W.

On the exposure, by controlling at least one of reticle stage driving system 11, stage driving system 24, and imaging characteristics correction controller 48 based on information of the two-dimensional distortion of pattern area PA of reticle R obtained at the time of the reticle alignment, main controller 20 performs overlay of pattern area PA of reticle R (exposure pattern) and a plurality of shot areas (base pattern) already formed on wafer W at a higher precision. The exposure operation based on the step-and-scan method, except for this point, is no different from the conventional operation, therefore the details thereabout are omitted.

When exposure has been completed, wafer W that has undergone exposure is unloaded from wafer stage WST. Then, the operation from and after the loading of wafer W described above is repeatedly performed, and a plurality of wafers in the lot are sequentially processed. After the processing of the lot has been completed, a similar processing (including the reticle alignment and measurement of the two-dimensional distorted shape of pattern area PA that accompanies the reticle alignment) is repeatedly performed on the wafers of the next lot. Incidentally, on the processing of the next lot, reticle exchange may be performed and a different reticle used, however, in the present embodiment, the initial measurement operation as previously described is performed also on the reticle that has been exchanged, and the measurement results, that is, the speckle information of pattern area PA of the reticle in the reference state is stored in the storage device, therefore, as previously described, measurement of the two-dimensional distorted shape of pattern area PA is performed on the reticle alignment in a similar manner as the description above.

As described in detail so far, according to exposure apparatus 100 of the present embodiment, each time the reticle alignment is performed, main controller 20 performs the measurement previously described, using speckle sensors $30_{L1}$, $30_{L2}$, $30_C$, $30_{R1}$, and $30_{R2}$, and based on the positional information of reticle stage RST measured by reticle interferometer 14 and the speckle information detected by speckle sensors $30_{L1}$, $30_{L2}$, $30_C$, $30_{R1}$, and $30_{R2}$, obtains the variation amount in the XY plane of the pattern area PA formed on the pattern surface of reticle R (two-dimensional distortion of pattern area PA). Therefore, even if a displacement occurs in a direction intersecting the optical axis of projection optical system PL (e.g., a plane parallel to the XY plane in pattern area PA) due to thermal deformation of reticle R by the irradiation of illumination light IL, the displacement can be detected. In particular, detecting the variation amount of the target using speckle detection allows detection with good accuracy, compared with when detecting the variation amount of the target using detection results of an image captured by an image-forming sensor of an image processing method similarly to the FIA system. Therefore, the variation amount can be detected with good precision, even if the variation (shape change) within the pattern surface of pattern area PA is a non-linear variation (shape change).

Further, according to exposure apparatus 100, at the time of scanning exposure in the exposure operation of the step-and-scan method performed after wafer alignment (EGA), main controller 20 controls at least one of the reticle stage driving system 11, stage driving system 24, and imaging characteristics correction controller 48 for overlay of the exposure pattern of reticle R and the base pattern on wafer W, based on the information described above of the variation amount in the XY plane of pattern area PA (the two-dimensional distortion of pattern area PA). Accordingly, even in the case involving distortion of pattern area PA (exposure pattern) caused by thermal deformation of reticle R or the like, the overlay accuracy of the exposure pattern of reticle R and the base pattern of wafer W can be improved.

It should be noted that in the embodiment described above, the case has been described where five speckle sensors (pattern measurement devices) 30 are provided, with the sensors being placed along the X-axis direction at a predetermined spacing at positions shifted by a predetermined amount to the +Y side of illumination area IAR. The speckle sensors provided, however, may be one, two, three, four, or six or more, and when more than one sensor is provided, the detection areas of each sensor are preferably placed at different positions in the pattern surface (or a surface in the vicinity). The speckle sensors when more than one are provided may also be lined and placed in a direction intersecting the Y-axis, so that their detection areas are not limited to the X-axis direction. However, speckle sensors (pattern measurement devices) 30 have to be placed at positions within the moving range of reticle stage RST where the pattern areas of reticle R and the speckles from fiducial plate RFM can be detected. Moreover, in the case more than one speckle sensors are provided, the placement is not limited to the example of being lined in the X-axis direction at a predetermined spacing, and the sensors do not have to be arranged in a line if the sensors are spaced apart at least in the X direction.

Moreover, the embodiment above describes the case where measurement of the two-dimensional distortion of pattern area PA of reticle R that involves speckle measurement is performed, adding to the reticle alignment performed at the beginning of each lot. This, however, is not limiting, and in principle the measurement of the two-dimensional distortion of pattern area PA described above may be carried out constantly real time during the operation of reticle stage RST, such as, for example, during scanning exposure. Measuring variation amount of the pattern by speckle detection differs from measurement using optical intensity as in aerial image measurement, and allows measurement with high precision even when reticle stage RST is moving at a high speed.

However, in the case the detection areas (measurement points) of a plurality of speckle sensors are offset in the scanning direction with respect to the optical axis as in the embodiment described above, a part of the measurement operation is to be performed during the acceleration/deceleration of reticle stage RST when real time measurement is performed. In this case, to remove the influence of deformation of the reticle caused by the acceleration that accompanies the acceleration/deceleration, the signal, which is obtained at the time of scanning operation in a state where the reticle is not heated, can be used as a reference, and a similar processing can be performed on the amount varying from the reference. Performing the real time measurement allows the change of position of the pattern area during the period of reticle alignment to be captured, which increases the expectations for further improvement in the overlay accuracy.

It should be noted that, while the case has been described where measurement (detection) using the five speckle sensors is performed during successive movement of reticle stage RST in the scanning direction in the embodiment described above, in such successive measurement, the amount of data that should be stored in the storage device may become huge. For the purpose of reducing the data amount, a discrete-stationary measurement may be employed. In this measurement, reticle stage RST can be moved in a stepping manner at a plurality of points (e.g., five) in the scanning direction, and at each stepping position, measurement (detection) by the speckle sensors is performed. Whether to employ successive measurement or to employ discrete-stationary measurement may be decided, for example, depending on the measurement accuracy required.

Moreover, the embodiment above describes the case when main controller 20, on the successive measurement described above, measures the two-dimensional distortion of the pattern area (displacement in the two-dimensional plane of each portion of the pattern area), based on measurement information of reticle interferometer 14 and measurement information of the speckle sensors. Alternately, other than this measurement, displacement in the Z-axis direction of the pattern area may also be measured in addition to the two-dimensional distortion of the pattern area, based on the measurement information of reticle interferometer 14 and the measurement information of the speckle sensors. By employing as speckle sensors 30, an image correlation displacement gage that detects position in the height direction of the measurement object using the principle of triangulation as is disclosed in, for example, Kokai (Japanese Patent Unexamined Application Publication) No. 2006-184091, displacement in the Z-axis direction in at least a portion of an area can be measured, in addition to measuring the two-dimensional distortion of at least a portion of an area of pattern area PA.

Figure 8:
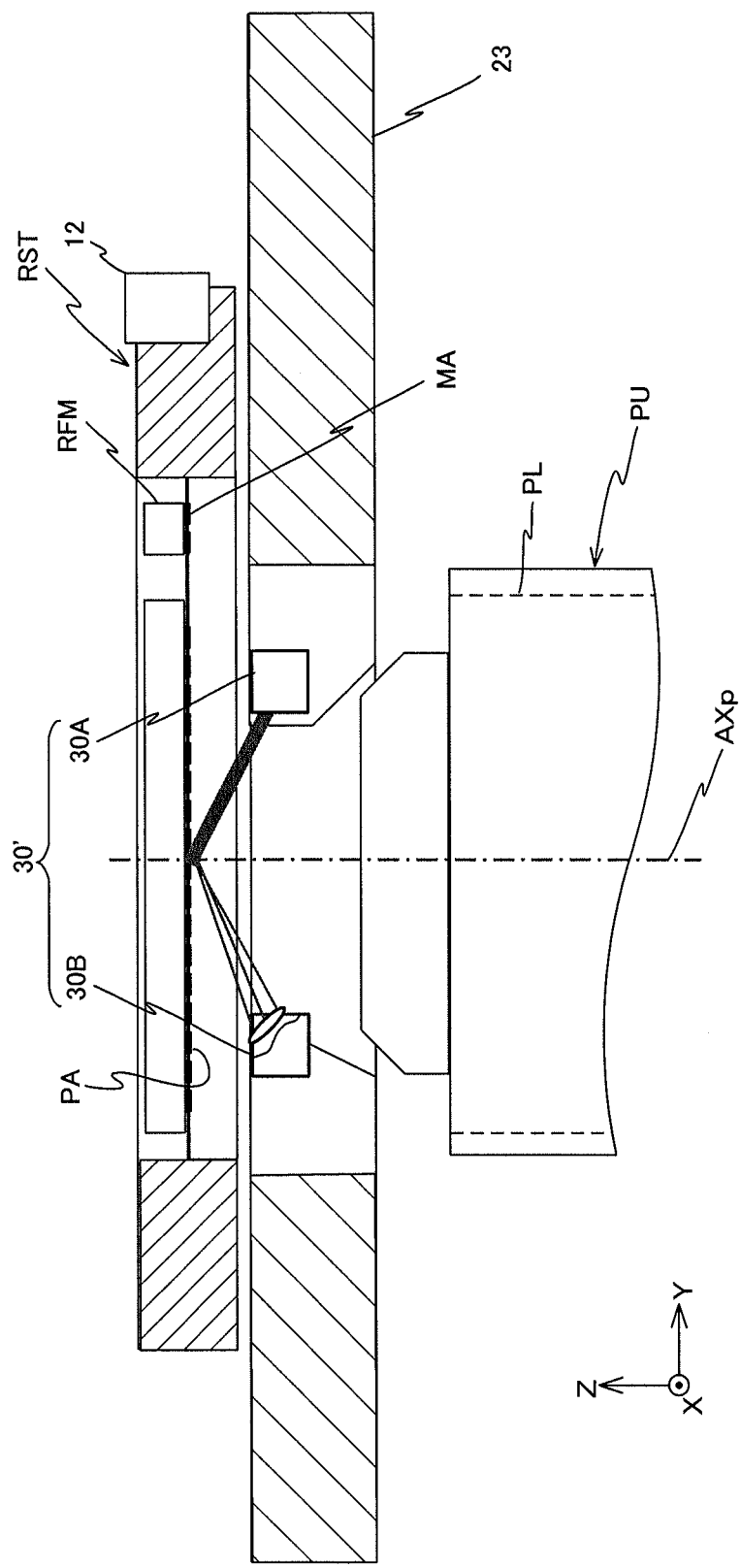
FIG. 8 is a view of assistance in explaining an exposure apparatus according to a modified example.

Moreover, in the embodiment described above, while a structure is described as an example where detection areas of a plurality of (five) speckle sensors are arranged offset in a scanning direction with respect to optical axis AX of projection optical system PL, this is not limiting, and at least one detection area of the plurality of sensors may be set at a portion of an area of illumination area IAR where illumination light IL passes. By employing an oblique-incidence optical system, for example, like the exposure apparatus of a modified example illustrated in FIG. 8, a structure can be considered where detection areas of a plurality of speckle sensors (pattern measurement device) are placed on optical axis AX in the scanning direction. The exposure apparatus of the modified example have a plurality of (five) speckle sensors 30' that are each structured including an irradiation unit 30A and a light-receiving unit 30B. Irradiation unit 30A includes a housing and a coherent light source incorporated in the housing, and light-receiving unit 30B includes a housing, and a lens, a pinhole plate, and a detector incorporated in the housing.

The structure of other parts of the exposure apparatus of the modified example is similar to the exposure apparatus according to the embodiment previously described.

The exposure apparatus according to the modified example can perform the successive measurement of the speckle previously described of the pattern area PA of reticle R even during the exposure operation by the step-and-scan method. This eliminates the necessity of adding the measurement sequence of the speckle when reticle alignment is performed, which allows the throughput to be further improved than the embodiment described above. Moreover, because the position of the exposure pattern itself is measured directly, controlling reticle stage driving system 11 for overlay of the exposure pattern and base pattern on the wafer based on the measurement results, this is equivalent to performing alignment of reticle stage RST using the exposure pattern itself. Therefore, the exposure apparatus of the modified example simplifies the processing as well as improves the overlay accuracy of the exposure pattern and the base pattern of the wafer. This case differs from when measuring the positional information of the reticle stage using an encoder system which includes a head that targets a grating section, and because the modified example is not affected by the variation of the stage coordinate system occurring, such as, due to the variation of the grating section, this is extremely advantageous when securing the overlay accuracy. Drift of the output of speckle sensor 30', however, may occur in this case as well; therefore, this drift component has to be removed, likewise to the embodiment described above. Moreover, to improve the measurement accuracy further, the reticle interferometer 14 described above or the encoder system may also be used together to measure the positional information of reticle stage RST in the XY plane.

The embodiment described above and the modified example (hereinafter, referred to together as the embodiments described above) described the case of using a speckle sensor as the sensor for detecting the distortion (displacement of each portion) of the pattern area. In the case, however, as previously described when the first information of the pattern is obtained, based on the positional information of the reticle and the detection information of the pattern in the pattern area obtained using the pattern measurement device (sensor) during the predetermined operation that involves moving the reticle when the reticle (mask) before the beginning of exposure is in the reference state, and the second information of the pattern is obtained, based on the positional information of the reticle and the detection information of the pattern obtained using the pattern measurement device (sensor) during the predetermined operation after a predetermined period of time has passed after the beginning of exposure, and then the variation information in the XY plane (and the Z-axis direction) of the pattern is obtained based on the difference between the second information and the first information corresponding to the same position of the reticle, the sensor does not have to be a speckle sensor. The sensor used in this case, for example, may be considered to be an image-forming imaging sensor employing an image-processing method similar to the FIA system that picks up and acquires the image of the pattern area.

Moreover, in the embodiments described above, while reticle R should have no drawing errors (or errors small enough to ignore) of the pattern or the like, using the speckle measurement previously described enables detection of drawing errors of the pattern such as, for example, deformation. Specifically, a reference reticle A is to be prepared, having a pattern drawn in advance using an electron-beam exposure apparatus with no drawing errors (e.g., deformation), then to this reference reticle, a measurement operation similar to the initial measurement operation previously described is to be performed, and information of the speckles measured is to be stored as reference information in the storage device. Moreover, to another reticle B that has a drawing error of the pattern, the measurement operation similar to the initial measurement operation previously described is to be performed, and information of the speckles measured is to be stored as speckle information in a reference state of reticle B in the storage device. Then, the speckle information in the reference state of reticle B and the reference information are compared, and when there is a difference between the two, reticle B can be judged to have a drawing error of the pattern and the difference can be expected to correspond to the drawing error. For example, when a part of a line-and-space pattern is deformed due to a drawing error, the speckle of the line-and-space pattern including this drawing error will differ from the speckle kept as reference information, therefore, the method described above allows detection of the deformation of the part of the line-and-space pattern.

It is to be noted that in the embodiments described above, while the exposure apparatus is a dry-type exposure apparatus that performs exposure of wafer W without liquid (water), this is not limiting, and as is disclosed in, for example, European Patent Application Publication No. 1,420,298, PCT International Publication No. 2004/055803, U.S. Pat. No. 6,952,253, the embodiments described above can also be applied to an exposure apparatus that forms a liquid immersion space including an optical path of an illumination light between a projection optical system and a wafer, and exposes the wafer with the illumination light via the projection optical system and the liquid in the liquid immersion space.

Moreover, in the embodiments described above, the case has been described where the exposure apparatus is a scanning stepper; however, this is not limiting, and the embodiments described above may also be applied to a stationary exposure apparatus such as a stepper. Moreover, the embodiments described above can also be applied to a reduction projection exposure apparatus of a step-and-stitch method that synthesizes a shot area and shot area, an exposure apparatus of a proximity method that does not use a projection optical system, and a mirror aligner.

Moreover, the embodiments described above can also be applied to a twin stage type exposure apparatus. The structure and the exposure operation of the twin stage type exposure apparatus is disclosed in, for example, U.S. Pat. Nos. 6,341,007, 6,400,441, 6,549,269, 6,590,634, 5,969,441, and 6,208,407.

Moreover, the projection optical system in the embodiments described above is not limited to a reduction system, and may also either be an equal or a magnifying system, projection optical system PL is not limited to a refractive system, and may also be a reflection system or a catadioptric system, and the projection image may be either an inverted image or an erected image. Moreover, the shape of the illumination area and the exposure area previously described is not limited to a rectangular shape, and may be shaped in, for example, an arc, a trapezoid, or a parallelogram.

Moreover, illumination light IL is not limited to the ArF excimer laser beam (wavelength 193 nm), and may also be an ultraviolet light such as a KrF excimer laser beam (wavelength 248 nm), or a vacuum-ultraviolet light such as an F2 laser beam (wavelength 157 nm). As disclosed in, for example, U.S. Pat. No. 7,023,610, as the vacuum-ultraviolet light, a harmonic wave may be used, which is a single-wavelength laser beam in the infrared or visual region oscillated from a DFB semiconductor laser or a fiber laser amplified by an erbium-doped (or erbium-and-ytterbium doped) fiber amplifier, and then whose wavelength is converted into the ultraviolet light using a nonlinear optical crystal.

Moreover, in the embodiments described above, illumination light IL of the exposure apparatus is not limited to light having the wavelength of 100 nm or more, and it goes without saying that light having a wavelength of less than 100 nm may also be used. The present invention can be applied to, for example, to an EUV exposure apparatus that uses an EUV (Extreme Ultraviolet) light in the soft X-ray region (e.g., wavelength region of 5 to 15 nm). Alternately, the embodiments described above can also be applied to an exposure apparatus that uses a charged particle beam such as an electron beam or an ion beam.

Furthermore, the embodiment described above can also be applied to an exposure apparatus that synthesizes two reticle patterns on a wafer via a projection optical system, and performs double exposure almost simultaneously of a shot area on the wafer by one scanning exposure, as disclosed in, for example, U.S. Pat. No. 6,611,316.

It should be noted that the object on which the pattern is to be formed in the embodiment above (the object subject to exposure on which the energy beam is to be irradiated) is not limited to a wafer, and may be other objects such as a glass plate, a ceramic substrate, a film member, and a mask blank.

Moreover, for measuring the positional information of the reticle stage and the wafer stage, an encoder can be used instead of the laser interferometer.

The usage of the exposure apparatus is not limited to the exposure apparatus for manufacturing semiconductors, and for example, may also be widely applied to an exposure apparatus for liquid crystals that transfers a liquid crystal display device onto, for example, a square-shaped glass plate, or to an exposure apparatus for manufacturing organic ELs, thin film magnetic heads, imaging devices (such as a CCD), micromachines, and DNA chips. Moreover, other than microdevices such as a semiconductor device, the embodiments described above can also be applied to an exposure apparatus that transfers a circuit pattern onto a glass substrate or a silicon wafer to manufacture a reticle or a mask used in an optical exposure apparatus, an EUV exposure apparatus, an X-ray exposure apparatus, and electron-beam exposure apparatus.

Electronic devices such as semiconductor devices are manufactured through the steps such as; a step for performing function/performance design of a device, a step for making a reticle based on this design step, a step for making a wafer from a silicon material, a lithography step for transferring a pattern of a mask (reticle) onto the wafer by the exposure apparatus (pattern formation apparatus) and the exposure method of the embodiments previously described, a development step for developing the wafer which has been exposed, an etching step for removing by etching an exposed member of an area other than the area where the resist remains, a resist removing step for removing the resist that is no longer necessary since etching has been completed, a device assembly step (including a dicing process, a bonding process, and a package process), and an inspection step. In this case, in the lithography step, because the device pattern is formed on the wafer by carrying out the exposure method previously described using the exposure apparatus of the embodiments described above, this allows a highly integrated device to be manufactured with good productivity.

It is to be noted that all publications, international publications, European Patent Application Publications, U.S. patent application Publications, and U.S. patents quoted in the description so far related to the exposure apparatus and the like, in their entirety, are incorporated herein by reference.

While the above-described embodiment of the present invention is the presently preferred embodiment thereof, those skilled in the art of lithography systems will readily recognize that numerous additions, modifications, and substitutions may be made to the above-described embodiment without departing from the spirit and scope thereof. It is intended that all such modifications, additions, and substitutions fall within the scope of the present invention, which is best defined by the claims appended below.

What is claimed is:

1. An exposure method in which an energy beam is irradiated on a mask, and a pattern formed on a pattern surface of the mask is transferred onto an object, comprising:
    irradiating a measurement light from a sensor on the pattern surface of the mask at a first point of time, and detecting a first information of a first area on the pattern surface;
    irradiating the measurement light from the sensor on the first area and detecting a second information of the first area, after a predetermined time has passed from the first point of time;
    obtaining a variation information of the first area caused by irradiation of the energy beam on the mask, based on the second information of the first area and the first information that have been detected; and
    calculating a measurement error of the variation information caused by a drift of the sensor.

2. The exposure method according to claim 1, wherein the first information and the second information contain information regarding a speckle generated when the measurement light is irradiated on the pattern surface.

3. The exposure method according to claim 2, wherein the information regarding the speckle includes information on at least one of speckle, speckle noise and a speckle pattern.

4. The exposure method according to claim 1, wherein the first point of time includes the time before transfer of the pattern onto the object begins.

5. The exposure method according to claim 1, further comprising:
    controlling at least one of a movement of the mask, a movement of the object, and imaging characteristics of a projection optical system, based on the variation information of the first area obtained, at the time of scanning exposure when the object is exposed via the projection optical system while the mask and the object synchronously perform relative movement with respect to the energy beam.

6. The exposure method according to claim 2, wherein the sensor irradiates a coherent beam as the measurement light different from the energy beam on the pattern surface of the mask and obtains the information regarding the speckle from the first area on the pattern surface.

7. The exposure method according to claim 6, wherein the sensor includes a plurality of sensors, and the plurality of sensors detect the information regarding the speckle from the pattern surface at each of a plurality of detection areas placed at different positions on the pattern surface.

8. The exposure method according to claim 7, wherein at least one of the plurality of sensors can detect in its detection area the information regarding the speckle from a mask alignment mark formed on the mask.

9. The exposure method according to claim 7, wherein the object is exposed via a projection optical system while the mask and the object synchronously perform relative movement with respect to the energy beam, and
the plurality of sensors can detect the information regarding the speckle from the pattern surface of the mask, in each of the detection areas placed apart from one another in a direction intersecting a direction of the relative movement in the pattern surface.

10. The exposure method according to claim 9, wherein the plurality of detection areas are placed lined along an axis in a direction intersecting the direction of the relative movement passing through the optical axis of the projection optical system, within the pattern surface.

11. The exposure method according to claim 3, wherein the variation information of the first area contains variation of the first area in a parallel direction, which is parallel to the pattern surface.

12. The exposure method according to claim 3, wherein the variation information of the first area contains variation of the first area in a direction intersecting the pattern surface.

13. The exposure method according to claim 6, wherein
the mask is held by a mask stage that has a fiducial member on which a fiducial pattern is formed, and
the measurement error of the variation information caused by the drift of the sensor is calculated, based on the information regarding the speckle from the fiducial member.

14. The exposure method according to claim 1, wherein
the second information is detected concurrently with the energy beam irradiating the object.

15. A device manufacturing method, the method including:
transferring the pattern onto a sensitive substrate using the exposure method according to claim 1; and
developing the sensitive substrate on which the pattern has been transferred.

* * * * *